(12) United States Patent
Choi et al.

(10) Patent No.: US 8,790,986 B2
(45) Date of Patent: Jul. 29, 2014

(54) METHODS OF MANUFACTURING SEMICONDUCTOR DEVICES

(71) Applicant: Samsung Electronics Co., Ltd., Suwon-si (KR)

(72) Inventors: Jae Hyoung Choi, Gyeonggi-do (KR); Ki Yeon Park, Gyeonggi-do (KR); Joon Kim, Seoul (KR); Cha Young Yoo, Gyeonggi-do (KR); Youn Soo Kim, Gyeonggi-do (KR); Ho Jun Kwon, Seoul (KR); Sang Yeol Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/705,320

(22) Filed: Dec. 5, 2012

(65) Prior Publication Data

US 2013/0149833 A1    Jun. 13, 2013

(30) Foreign Application Priority Data

Dec. 13, 2011    (KR) .................. 10-2011-0134000

(51) Int. Cl.
    *H01L 21/20*    (2006.01)

(52) U.S. Cl.
    USPC .......... 438/381; 438/396; 257/532; 257/773

(58) Field of Classification Search
    USPC .......... 438/381, 396, 478; 257/532, E21.08, 257/E21.09, E21.35, E29.342, E29.343
    See application file for complete search history.

(56) References Cited

U.S. PATENT DOCUMENTS

| 7,923,343 B2 * | 4/2011 | Eun .................. 438/396 |
| 2012/0025390 A1 * | 2/2012 | Jeong .................. 257/773 |
| 2013/0001744 A1 * | 1/2013 | Kim .................. 257/532 |

FOREIGN PATENT DOCUMENTS

| KR | 102008005521 A | * | 6/2008 | .......... H01L 27/04 |
| KR | 1020080055215 A |  | 6/2008 | |
| KR | 1020090044865 A |  | 6/2009 | |
| KR | 102009004486 A | * | 7/2009 | .......... H01L 27/108 |

* cited by examiner

*Primary Examiner* — Charles Garber
*Assistant Examiner* — Syed Gheyas
(74) *Attorney, Agent, or Firm* — Myers Bigel Sibley & Sajovec, P.A.

(57) ABSTRACT

A method of manufacturing a semiconductor device, the method including: preparing a semiconductor substrate including a mold layer and a support layer disposed on the mold layer; forming multiple holes that pass through the mold layer and the support layer; forming multiple bottom electrodes in the holes; exposing at least a portion of the bottom electrodes by removing at least a portion of the mold layer; removing a portion of the bottom electrodes from an exposed surface of the bottom electrodes; and sequentially forming a dielectric layer and a top electrode layer on the bottom electrodes.

16 Claims, 19 Drawing Sheets

METHODS OF MANUFACTURING SEMICONDUCTOR DEVICES

CROSS-REFERENCE TO RELATED APPLICATIONS

This application claims the benefit of Korean Patent Application No. 10-2011-0134000, filed on Dec. 13, 2011, in the Korean Intellectual Property Office, the disclosure of which is incorporated herein in its entirety by reference.

BACKGROUND

With the rapid progress in the electronic industries, semiconductor devices with higher speed and higher performance are increasingly supplied. Thus, in order to accomplish both high speed and high performance of semiconductor devices at the same time, an integration degree of the semiconductor devices may be further increased. Regarding semiconductor devices including a capacitor, as the integration degree of the semiconductor devices is increased, an aspect ratio of the capacitor is further increased and spaces between capacitors are further narrowed, which may increase the difficulty of manufacturing reliable semiconductor devices including capacitors.

SUMMARY

The inventive concept provides a method of manufacturing a semiconductor device including a capacitor having reliability.

According to some embodiments of the inventive concept, there are provided methods of manufacturing a semiconductor device. Such methods may include forming multiple bottom electrodes in multiple holes that pass through a mold layer and a support layer, exposing a portion of the bottom electrodes by removing a portion of the mold layer, removing a portion of ones of the bottom electrodes from an exposed surface of respective ones of the bottom electrodes, and sequentially forming a dielectric layer and a top electrode layer on the bottom electrodes.

Some embodiments provide that exposing the portion of the bottom electrodes by removing the portion of the mold layer includes performing partial removing operations multiple times. In some embodiments, removing the portion of the ones of the plurality of bottom electrodes includes oxidizing a portion of the bottom electrodes from each exposed surface of the bottom electrodes and removing a portion of the ones of the oxidized bottom electrodes. Some embodiments provide that oxidizing the portion of the bottom electrodes is performed in an atmosphere of $O_2$ plasma, $O_3$ plasma, $O_3$, $O_2$, or $H_2O$ (vapor) and/or in the air atmosphere. In some embodiments, a sacrificial oxide layer is formed on each exposed surface of the bottom electrodes corresponding to oxidizing the portion of the bottom electrodes.

Some embodiments provide that removing the portion of the bottom electrodes includes removing a portion of an exposed portion of the support layer such that a surface of the support layer exposed between adjacent bottom electrodes is concavely formed. Some embodiments provide that only an upper portion of the mold layer is removed corresponding to exposing the portion of the bottom electrodes. In some embodiments, a portion of a remaining portion of the mold layer is removed corresponding to removing of the portion of the bottom electrodes.

Some embodiments provide that the mold layer is completely removed corresponding to exposing the portion of the bottom electrodes. In some embodiments, a portion of an exposed portion of the support layer is removed corresponding to removing the portion of the bottom electrodes. In some embodiments, a portion of an exposed portion of the support layer is removed such that the support layer has a thinner thickness away from each of the plurality of the bottom electrodes corresponding to removing the portion of the bottom electrodes.

In some embodiments, a portion of the bottom electrodes away from the semiconductor substrate is removed from an exposed surface of the bottom electrodes more than a portion of the bottom electrodes near the semiconductor substrate.

Some embodiments include preparing the semiconductor substrate including the mold layer and the support layer that is disposed on the mold layer. In some embodiments, a distance between adjacent bottom electrodes from among the bottom electrodes is increased more in a portion away from the semiconductor substrate than in a portion near the semiconductor substrate corresponding to removing the portion of the bottom electrodes. Some embodiments provide that the bottom electrodes are formed of a metal and/or a conductive metal nitride.

Some embodiments of the inventive concept are directed to methods of manufacturing a semiconductor device. Embodiments according to such methods may include forming multiple holes that pass through a mold layer and a support layer on a semiconductor substrate, forming multiple bottom electrodes in the holes, removing the mold layer to expose the bottom electrodes by removing multiple portions of the mold layer using a corresponding multiple partial removing operations, and sequentially forming a dielectric layer and a top electrode layer on the bottom electrodes.

Some embodiments provide that, between the partial removing operations, a portion of the bottom electrodes is oxidized from each exposed surface of the bottom electrodes and a portion of the oxidized bottom electrodes is removed. In some embodiments, removing the portion of the bottom electrodes includes removing a portion of the bottom electrodes to exposed portions of the bottom electrodes. Some embodiments provide that a ratio of a surface area of a portion of the bottom electrodes away from the semiconductor substrate with respect to a surface area of a portion of the bottom electrodes near the semiconductor substrate is reduced.

In some embodiments, removing the portion of the bottom electrodes includes removing a portion of an exposed portion of the support layer such that a surface of the support layer exposed between adjacent bottom electrodes among the bottom electrodes is concavely formed.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION OF THE EMBODIMENTS

Figure 1:
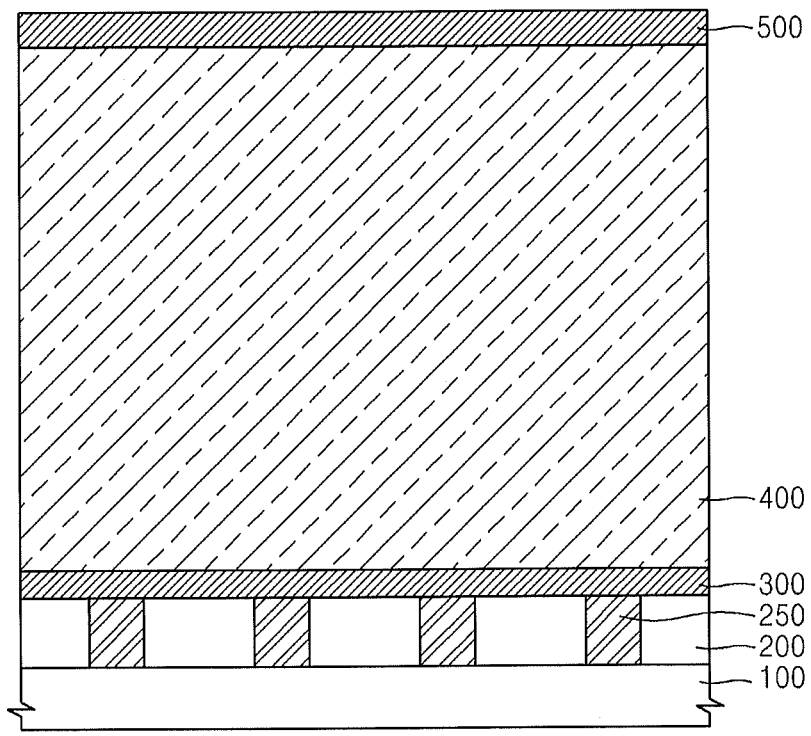
FIG. 1 is a cross-sectional view illustrating operations of forming a mold layer and a support layer according to some embodiments of the inventive concept.

The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, elements may be enlarged compared to their actual sizes for convenience of explanation, and ratios of the elements may be exaggerated or reduced.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. This applies to interpretation of other expressions for describing the relationship between elements, i.e., "between" and "directly between" or "adjacent" and "directly adjacent".

It will be understood that, although the terms first, second, third etc. may be used herein to describe various elements, components, regions, layers and/or sections, these elements, components, regions, layers and/or sections should not be limited by these terms. These terms refer to a particular order, rank, or superiority and are only used to distinguish one element, component, region, layer or section from another element, component, region, layer or section. Thus, a first element, component, region, layer or section discussed below could be termed a second element, component, region, layer or section without departing from the teachings of the example embodiment. For example, a first element may be referred to as a second element, and similarly, a second element may be referred to as a first element without departing from the scope of protection of the inventive concept.

As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The terms used herein may be interpreted in the meaning that is well known to one of ordinary skill in the art unless the terms are not defined otherwise.

Example embodiments of the inventive concept will be described more fully with reference to the accompanying drawings. As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view illustrating an operation of forming a mold layer 400 and a support layer 500 according to some embodiments of the inventive concept.

Referring to FIG. 1, an interlayer insulating layer 200 is formed on a semiconductor substrate 100, and a contact plug 250 that passes through the interlayer insulating layer 200 is formed.

The semiconductor substrate 100 may be, for example, a semiconductor substrate having a flat upper surface, such as a silicon substrate. In some embodiments, the semiconductor substrate 100 may be, for example, a compound semiconductor substrate such as a silicon-on-insulator (SOI) substrate, a silicon-germanium substrate, and/or a gallium-arsenic substrate, among others.

For example, an impurity injection area (not shown), such as a well that is needed to form a semiconductor device such as a transistor, may be formed in the semiconductor substrate 100, and a device isolation layer (not shown) may be disposed in the semiconductor substrate 100. The device isolation layer may be formed by filling a trench (not shown) formed in the semiconductor substrate 100 in a photolithography process, with an insulating material. The device isolation layer may be formed by forming an insulating material layer (not shown) on the semiconductor substrate 100, in which the trench is formed, so as to completely fill the trench, and by removing the insulating material layer except a portion thereof in the trench. The device isolation layer may be, for example, an oxide, a nitride, or a combination thereof. The device isolation layer may be, for example, a multiple complex layer including a buffer oxide layer, a trench liner nitride layer, and/or a buried oxide layer.

An active area (not shown) that is isolated may be formed on the semiconductor substrate 100 by the device isolation layer. That is, the active area may be a portion of the semiconductor substrate 100 that is defined by the device isolation layer.

An impurity having conductivity type (e.g., n-type or p-type) may be implanted into a portion of the active area to form source and drain areas (not shown). A gate structure (not shown) including a gate insulating layer (not shown) and a gate line (not shown) may be disposed on the active area or in the active area to form a transistor. The gate line is electrically insulated from the active area by the gate insulating layer, and may formed of doped polysilicon, a metal (e.g., W, Ti, or Cu), a metal silicide, or a metal nitride, or may have a stack structure including these materials. In addition, a capping pattern (not shown) may be formed on the gate line, and a gate spacer (not shown) may be formed on two sides of the gate line and the capping pattern to thereby form the gate structure. The gate insulating layer may be formed using a silicon oxide layer or an insulating layer having a high permittivity. Also, the capping pattern and the gate spacer may be formed using a silicon nitride layer.

In addition, a bit line (not shown) may be further formed in or on the semiconductor substrate 100. The bit line may be formed to cross the gate, line or to be parallel to the gate line, and may be insulated from the gate line using insulating materials. The bit line may be formed of doped polysilicon, a metal (e.g., W, Ti, or Cu), a metal silicide, or a metal nitride, or may have a stack structure including these materials. A bit line capping pattern (not shown) may be formed on the bit line, and a bit line spacer (not shown) may be formed on two sides of the bit line and the bit line capping pattern.

The interlayer insulating layer 200 may be a single film, or may be a multiple film that may be obtained by performing deposition at least twice and may include multiple layers. For example, an insulating layer for separating between the gate lines, an insulating layer for separating between the bit lines, an insulating layer for separating between the gate lines and the bit lines, and/or an insulating layer covering the bit lines may be included in the interlayer insulating layer 200. In addition, the insulating layers may each be a single film or a multiple film that is obtained by performing deposition at least twice. The interlayer insulating layer 200 may include, for example, a silicon oxide or a silicon nitride.

The contact plug 250 may be formed by etching the interlayer insulating layer 200 to expose the semiconductor substrate 100, that is, the source or drain region of the active area. The contact plug 250 may be formed by stacking doped silicon, a metal, a metal silicide, and/or a metal nitride, or using only doped polysilicon. However, if the interlayer insulating layer 200 is a multiple film, the contact plug 250 may be formed in several processes. For example, the contact plug 250 may be formed in a two-step process including an operation in which a portion of the insulating layer for separating between the gate lines may be etched to form a landing pad that is connected to the transistor via the source or drain region, and an operation in which a portion of the insulating layer for separating between the bit lines or a portion of the insulating layer for separating between the gate lines and the bit lines may be etched to form a buried plug that is connected to the landing pad. The landing pad and the buried plug may be formed by stacking a doped polysilicon, a metal, a metal silicide or a metal nitride, or using only a doped polysilicon. Also, according to necessity, an additional plug that is connected to the buried plug may be further formed.

An etch stopper layer 300 covering the interlayer insulating layer 200 and the contact plug 250 may be formed on the semiconductor substrate 100. The etch stopper layer 300 may be formed of, for example, a nitride.

The mold layer 400 may be formed on the etch stopper layer 300. The mold layer 400 may be formed of, for example, an oxide, and may have a thickness of about several thousands to several tens of thousands Å.

A support layer 500 may be formed on the mold layer 400. The support layer 500 may be formed of a material having a different etching selectivity from that of the mold layer 400. For example, the mold layer 400 may be formed of a nitride, and may have a thickness of about several hundreds to several thousands Å. The support layer 500 may be formed by forming a support material layer (not shown) covering the mold layer 400 and then by performing an etching operation to the support material layer so as to have a strip form.

Figure 2:
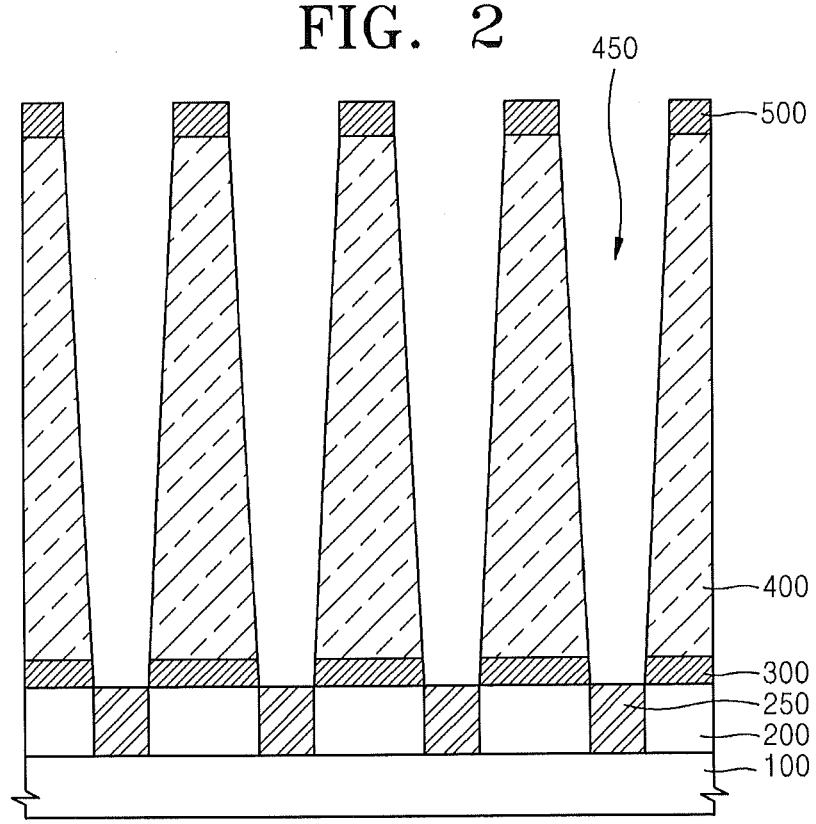
FIG. 2 is a cross-sectional view illustrating operations of forming a hole that passes through a mold layer and a support layer according to some embodiments of the inventive concept.

FIG. 2 is a cross-sectional view illustrating operations of forming a hole 450 that passes through the mold layer 400 and the support layer 500 according to some embodiments of the inventive concept.

Referring to FIG. 2, the support layer 500 and the mold layer 400 are etched in a potion where a bottom electrode is to be formed, until the contact plug 250 is exposed to thereby form a plurality of holes 450. The plurality of holes 450 may be arranged in a first direction that is horizontal to a main surface of a semiconductor substrate 100 and a second direction different from the first direction.

The plurality of holes 450 may be formed to have, for example, a diameter of about several tens of nm and arranged at distances of about several tens of nm. When a dry etching operation is performed in order to form the plurality of holes 450, a bottom portion of the holes 450 may be less etched than an inlet portion of the holes 450, and accordingly, diameters of the holes 450 may be greater away from the semiconductor substrate 100 than diameters of the holes 450 near the semiconductor substrate 100. Stated differently, distances between the holes 450 may be smaller away from the semiconductor substrate 100 than near the semiconductor substrate 100.

Figure 3:
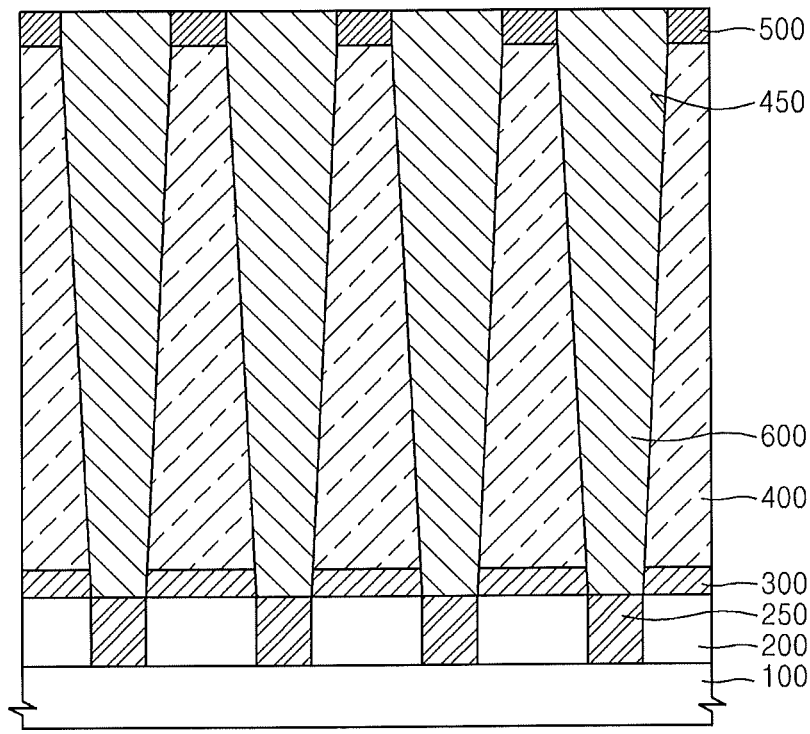
FIG. 3 is a cross-sectional view illustrating operations of forming a bottom electrode according to some embodiments of the inventive concept.

FIG. 3 is a cross-sectional view illustrating operations of forming a bottom electrode 600 according to some embodiments of the inventive concept.

Referring to FIG. 3, a bottom electrode 600 that fills each of the holes 450 is formed on the semiconductor substrate 100. The bottom electrode 600 may be formed by depositing a conductive material (not shown) on the semiconductor substrate 100 to fill each of the holes 450, and by separating the conductive material in each of the holes 450 using an etchback process and/or a chemical mechanical polishing (CMP) process.

The bottom electrode 600 may be formed of, for example, a metal or a conductive metal nitride layer. The bottom electrode 600 may be formed of at least one conductive material selected from the group consisting of Ti, W, Ta, TiN, NbN, TaN, and/or WN, among others.

Figure 4:
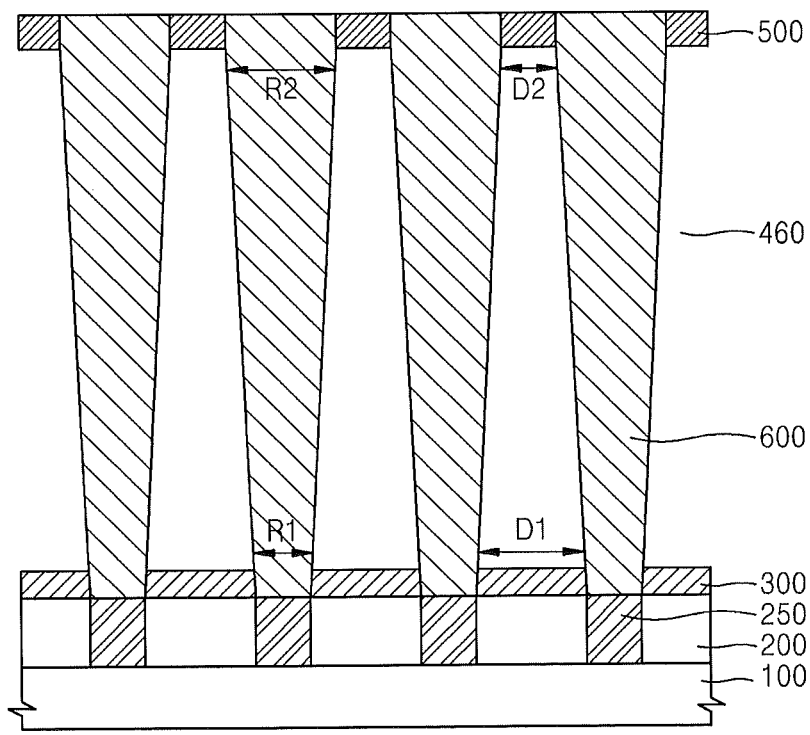
FIG. 4 is a cross-sectional view illustrating operations of removing a mold layer according to some embodiments of the inventive concept.

FIG. 4 is a cross-sectional view illustrating operations of removing the mold layer 400 according to some embodiments of the inventive concept.

Referring to FIGS. 3 and 4, the mold layer 400 is removed to form the bottom electrode 600 having a pillar shape, thereby forming empty space 460 around the bottom electrode 600. The mold layer 400 may be removed using a wet etching operation. The mold layer 400 may be removed using, for example, a Limulus amebocyte lysate (LAL) lift-off process.

After the mold layer 400 is removed, a lower portion of the bottom electrode 600 may be supported by the etch stopper layer 300, and an upper portion of the bottom electrode 600 may be supported by the support layer 500.

A first diameter R1 of the lower portion of the bottom electrode 600 and a second diameter R2 of the upper portion of the bottom electrode 600 from among portions of the bottom electrode 600 that are exposed as the mold layer 400 is removed may be determined according to diameters of the holes 450 according to depths described above. A surface area of a lowermost portion of the bottom electrode 600 and a surface area of an uppermost portion of the bottom electrode 600 from among portions of the bottom electrode 600 that are exposed as the mold layer 400 is removed may be proportional to the first and second diameters R1 and R2 of the bottom electrode 600, respectively. Thus, a ratio between the surface areas of the lowermost portion and the uppermost portion of the bottom electrode 600 is proportional to a ratio between the first diameter R1 and the second diameter R2.

If diameters of the holes 450 are different according to depths, distances between a plurality of bottom electrodes 600 that are adjacent to one another may vary according to heights of portions of the bottom electrodes 600. That is, among portions of the bottom electrode 600 that are exposed by removing the mold layer 400, a first distance D1 between lower portions of the bottom electrodes 600 and a second distance D2 between upper portions of the bottom electrodes 600 may vary according to variation of diameters of the holes 450 according to the depths.

Figure 5A:
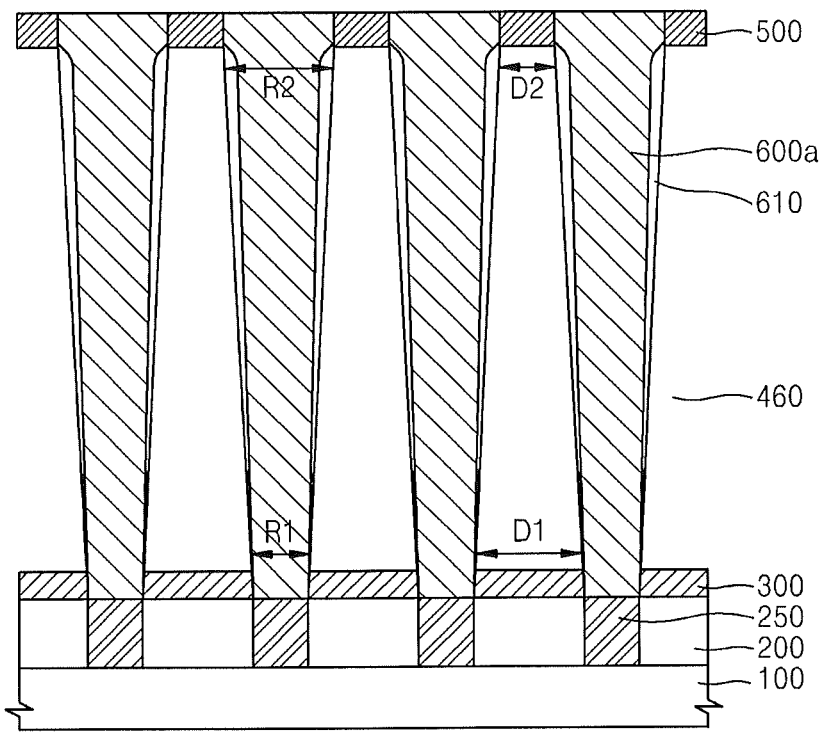
FIGS. 5A and 5B are cross-sectional views illustrating operations of oxidizing a portion of a bottom electrode according to some embodiments of the inventive concept and according to a modification thereof.

FIG. 5A is a cross-sectional view illustrating operations of oxidizing a portion of the bottom electrode 600 according to some embodiments of the inventive concept.

Referring to FIG. 3 and FIG. 5A, a portion of the bottom electrode 600 is oxidized from each exposed surface of the bottom electrodes 600 exposed by removing the mold layer 400, to form an oxidized portion 610 on the remaining bottom electrode 600a. If the bottom electrode 600 is formed of, for example, Ti or TiN, the oxidized portion 610 may be formed of a titanium oxide.

The oxidized portion 610 may be formed in an atmosphere of $O_2$ plasma, $O_3$ plasma, $O_3$, $O_2$, and/or $H_2O$ (vapor) or in the air atmosphere. For example, after removing the mold layer 400 and performing a washing operation, in a drying operation, $O_3$ $O_2$, $H_2O$ and/or the air may be injected and/or an atmosphere of $O_3$ $O_2$, $H_2O$ and/or the air may be set so as to oxidize a portion of the bottom electrode 600. In some embodiments, after removing the mold layer 400, an atmosphere of $O_3$ or $O_2$ plasma may be formed to oxidize a portion of the bottom electrode 600.

If the bottom electrode 600 has a large aspect ratio, less oxygen atoms which are included in $O_2$, $O_3$, and/or $H_2O$ and which may be used to oxidize a portion of the bottom electrode 600 may be supplied to portions of the bottom electrode 600 near the semiconductor substrate 100 than portion of the bottom electrode 600 away from the semiconductor substrate 100. In this case, more of the portions of the bottom electrode 600 away from the semiconductor substrate 100 may be oxidized than the portions of the bottom electrode 600 near the semiconductor substrate 100. That is, the portions of the oxidized portion 610 of the bottom electrode 600 that are away from the semiconductor substrate 100 may have a larger thickness than the portions of the bottom electrode 600 that are near the semiconductor substrate 100.

For example, an exposure time may be adjusted in the atmosphere of $O_2$ plasma, $O_3$ plasma, $O_3$, $O_2$, and/or $H_2O$ (vapor) or in the air atmosphere so as to adjust a flow rate of $O_3$, $O_2$, $H_2O$ (vapor) and/or the air, and/or density of $O_2$ plasma or $O_3$ plasma may be adjusted to adjust a thickness difference in the oxidized portion 610 according to positions.

Some embodiments provide that if the first diameter R1 and the second diameter R2 are similar, there may be no thickness difference in the oxidized portion 610 of the bottom electrode 600 according to positions or the thickness difference may be minimized.

Figure 5B:
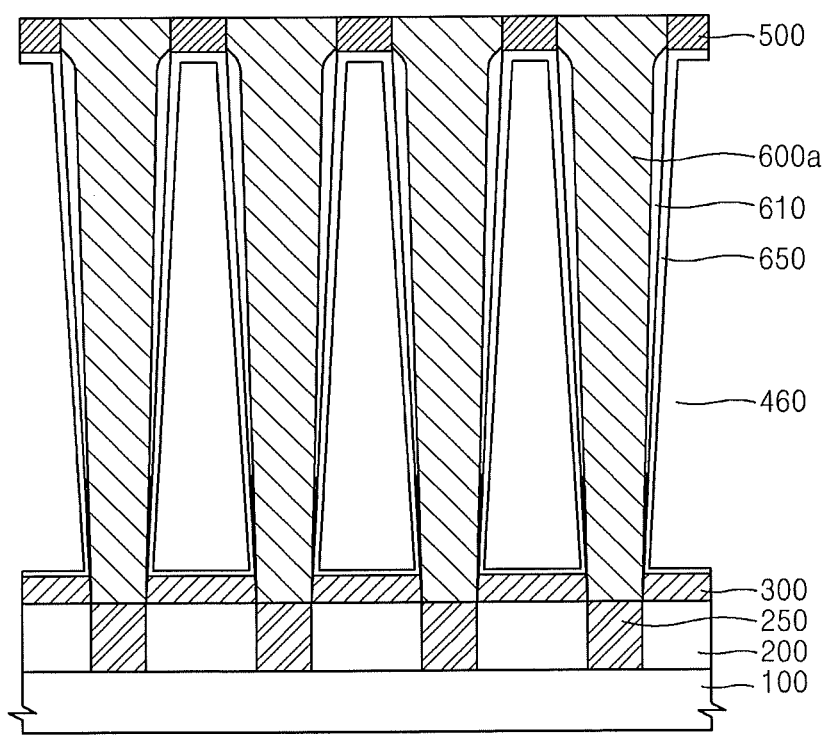

FIG. 5B is a cross-sectional view illustrating operations of oxidizing a portion of the bottom electrode 600 according to a modification example of the embodiment of FIG. 5B.

Referring to FIGS. 4 and 5B, a sacrificial oxide layer 650 is formed on each exposed surface of the bottom electrodes 600 that is exposed by removing the mold layer 400. Portions of the bottom electrodes 600 are oxidized under influence of an oxygen source for forming the sacrificial oxide layer 650, thereby forming an oxidized portion 610 on the remaining bottom electrode 600a. That is, while the oxidized portion 610 illustrated in FIG. 5A may be separately formed in the atmosphere of $O_2$ plasma, $O_3$ plasma, $O_3$, $O_2$, and/or $H_2O$ (vapor) or in the air atmosphere, the oxidized portion 610 illustrated in FIG. 5B may be formed at the same time when forming the sacrificial oxide layer 650. For example, the sacrificial oxide layer 650 may be formed of the same material as a dielectric layer which is to be formed later.

Figure 6:
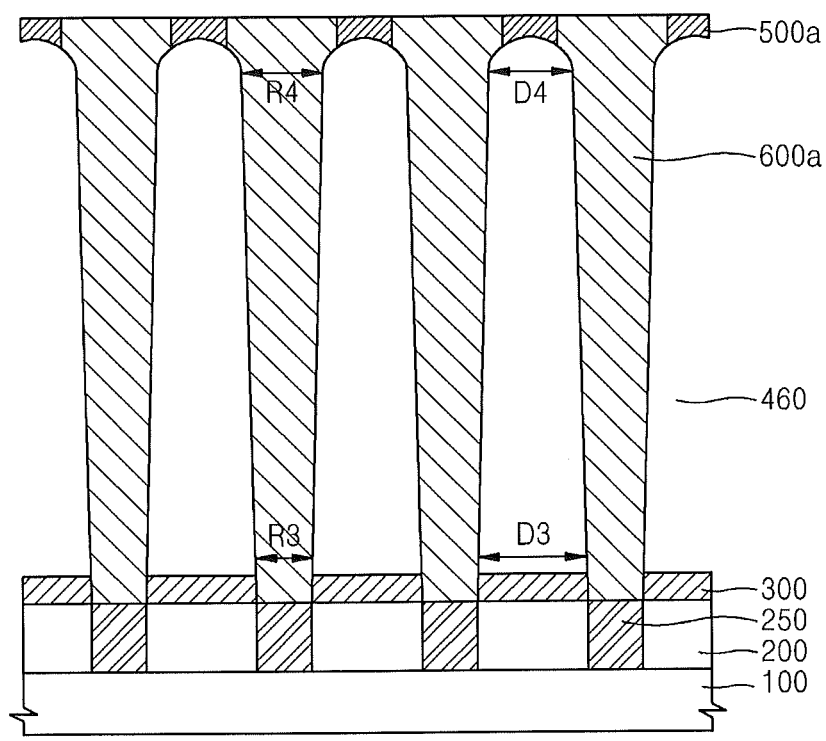
FIG. 6 is a cross-sectional view illustrating operations of removing oxides formed on a bottom electrode according to some embodiments of the inventive concept.

FIG. 6 is a cross-sectional view illustrating operations of removing oxides formed on a bottom electrode 600a according to embodiments of the inventive concept.

Referring to FIGS. 5A and 6, the oxidized portion 610 is removed to leave only the bottom electrode 600a which has conductivity. By removing the oxidized portion 610, the empty space 460 may be extended. The oxidized portion 610 may be removed using an etching process comprising HF and/or a LAL lift-off process. If a portion the oxidized portion 610 away from the semiconductor substrate 100 is thicker than a portion of the oxidized portion 610 near the semiconductor substrate 100, a thickness of a portion removed from the bottom electrode 600 illustrated in FIG. 4 may be greater away from the semiconductor substrate 100 than near the semiconductor substrate 100.

After leaving only the bottom electrode 600a having conductivity, by removing the oxidized portion 610, selectively, a $NH_3$ gas atmosphere and/or a plasma atmosphere may be formed in the bottom electrode 600a and a nitridization process with respect to the remaining bottom electrode 600a may be additionally performed.

Referring to FIGS. 5B and 6, the sacrificial oxide layer 650 and the oxidized portion 610 are removed to leave only the bottom electrode 600a having conductivity. The sacrificial oxide layer 650 and the oxidized portion 610 may be removed using an etching operation comprising HF and/or a LAL lift-off process.

When comparing the first diameter R1, which is a diameter of the lower portion of the bottom electrode 600 of FIG. 4, and the second diameter R2, which is a diameter of the upper portion of the bottom electrode 600 of FIG. 4, with a third diameter R3 which is a diameter of a lower portion of the bottom electrode 600a of FIG. 6 and a fourth diameter R4 which is a diameter of an upper portion of the bottom electrode 600a of FIG. 6, the third diameter R3 is similar as or a little bit less than the first diameter R1, but the fourth diameter R4 has increased relatively greatly compared to the second diameter R2.

Thus, a ratio of the surface area of the portion of the bottom electrode 600a illustrated in FIG. 6 away from the semiconductor substrate 100 with respect to the surface area of the portion of the bottom electrode 600a near the semiconductor substrate 100 may be smaller than the ratio regarding the bottom electrode 600 illustrated in FIG. 4.

Likewise, when comparing a third distance D3, which is a distance between the bottom electrodes 600a near the substrate 100, and a fourth distance D4, which is a distance between the bottom electrodes 600a away from the substrate, with the first distance D1 and the second distance D2 illustrated in FIG. 4, the third distance D3 is similar as or a little bit less than the first distance D1, but the fourth distance D4 has increased relatively greatly compared to the second distance D2. That is, distances between adjacent bottom electrodes 600a away from the semiconductor substrate 100 have further increased more than those near the semiconductor substrate 100.

If there is hardly or no thickness difference in the oxidized portions 610 of the bottom electrode 600a illustrated in FIG. 5A or FIG. 5B, the distances between adjacent bottom electrodes 600a may increase regardless of the heights of the portions of the bottom electrode 600a.

In addition, when removing the sacrificial oxide layer 650 and the oxidized portion 610, a portion of the support layer 500 illustrated in FIG. 5A or 5B is also removed, thereby forming a remaining support layer 500a having a smaller thickness away from the bottom electrode 600a. Accordingly, a surface of the support layer 500a that is exposed between the adjacent bottom electrodes 600a may be concavely formed.

Figure 7:
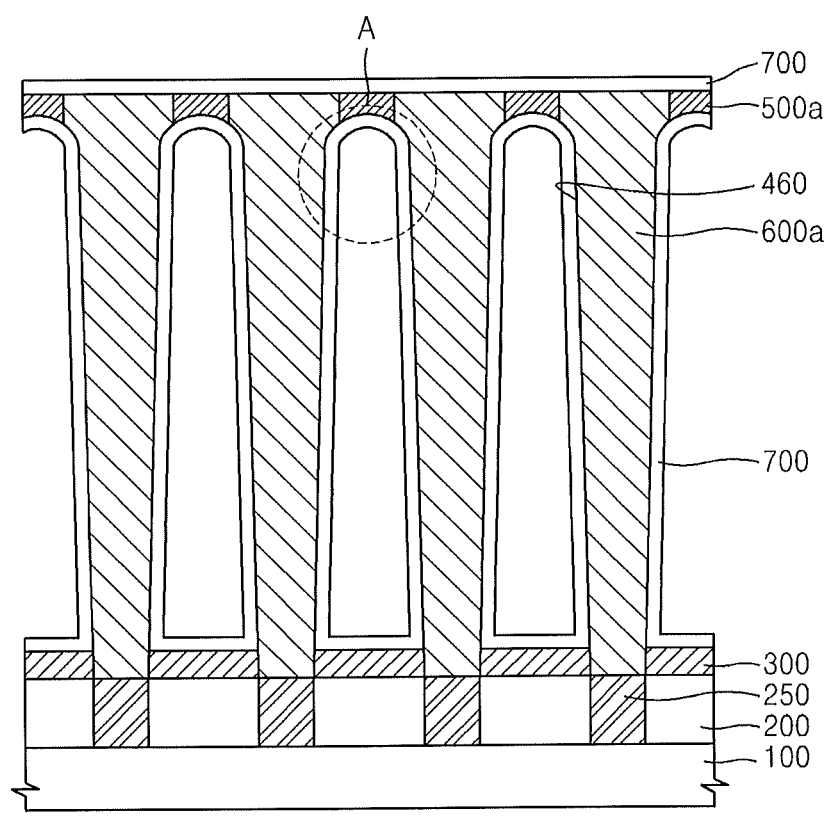
FIG. 7 is a cross-sectional view illustrating operations of forming dielectric layer according to some embodiments of the inventive concept.

FIG. 7 is a cross-sectional view illustrating an operation of forming a dielectric layer 700 according to some embodiments of the inventive concept.

Referring to FIG. 7, a dielectric layer 700 is formed to completely cover the surface of the bottom electrode 600a. The dielectric layer 700 may also be formed on each exposed surface in the empty space 460, that is, on the bottom electrode 600a, the support layer 500a, and the etch stopper layer 300. For example, the dielectric layer 700 may be formed of $ZrO_2$, $HfO_2$, $SiO_2$, $GeO_2$, $Al_2O_3$, $TiO_2$, $Ta_2O_5$, $Nb_2O_5$, $SrTiO_3$ and/or $(Ba, Sr)TiO_3$. The dielectric layer 700 may be formed using, for example, an atomic layer deposition (ALD) method and/or a sequential flow deposition (SFD) method.

If the distances between the bottom electrodes 600a are not increased, distances between dielectric layers may be close to one another between the adjacent bottom electrodes 600a. For example, if a distance between adjacent bottom electrodes 600a is several tens of nm or less, a distance between the dielectric layers 700 may be several nm or less according to a thickness of the dielectric layers 700, and in some cases, the bottom electrode 600a on which the dielectric layer 700 is formed may bend due to Van der Waals forces or the bottom electrode 600a contact another, adjacent bottom electrode 600a, and deformation of the bottom electrodes 600a as described herein may cause defects in a semiconductor device. However, as illustrated in FIGS. 5A, 5B, and 6, if the distances between the adjacent bottom electrodes 600a are increased, deformation of the bottom electrode 600a as described above may be reduced or prevented.

A portion "A" of the support layer 500a where the dielectric layer 700 is formed below the support layer 500a has a concave surface between the bottom electrodes 600a, and accordingly, the support layer 500a and the dielectric layer 700 formed around the support layer 500a may be curved along the concave surface of the support layer 500a. Accordingly, a portion of the dielectric layer 700 formed on a lower surface of the support layer 500a and a portion of the dielectric layer 700 formed on the bottom electrode 600a adjacent two sides of the support layer 500a may be formed while having a predetermined distance therebetween. Accordingly, Van der Waals forces which may be generated between the dielectric layers 700 on the lower surface of the support layer 500a may be reduced or minimized, thereby reducing or preventing deformation of the bottom electrodes 600a. Also, an exposed surface may be sufficiently formed on a portion of the dielectric layers 700 formed below the support layer 500a.

Consequently, deformation of the bottom electrodes which may be caused as capacitors are formed at narrow distances may be reduced or prevented. That is, the bottom electrodes are supported by the support layer so as to prevent falling of the bottom electrodes, and Van der Waals forces which may be generated between the adjacent bottom electrodes may be reduced, thereby preventing bending of the bottom electrodes or contact between the adjacent bottom electrodes.

In addition, by concavely forming a surface of the support layer, the support layer and the dielectric layer formed on the bottom electrode around the support layer are formed to have a curved surface so that portions of the dielectric layer are formed while having a predetermined distance therebetween.

Accordingly, defects of semiconductor devices due to deformation of capacitors including bottom electrodes, such as bit failure, are prevented, thereby increasing an integration degree of the semiconductor device and manufacturing semiconductor devices having reliability.

Figure 8:
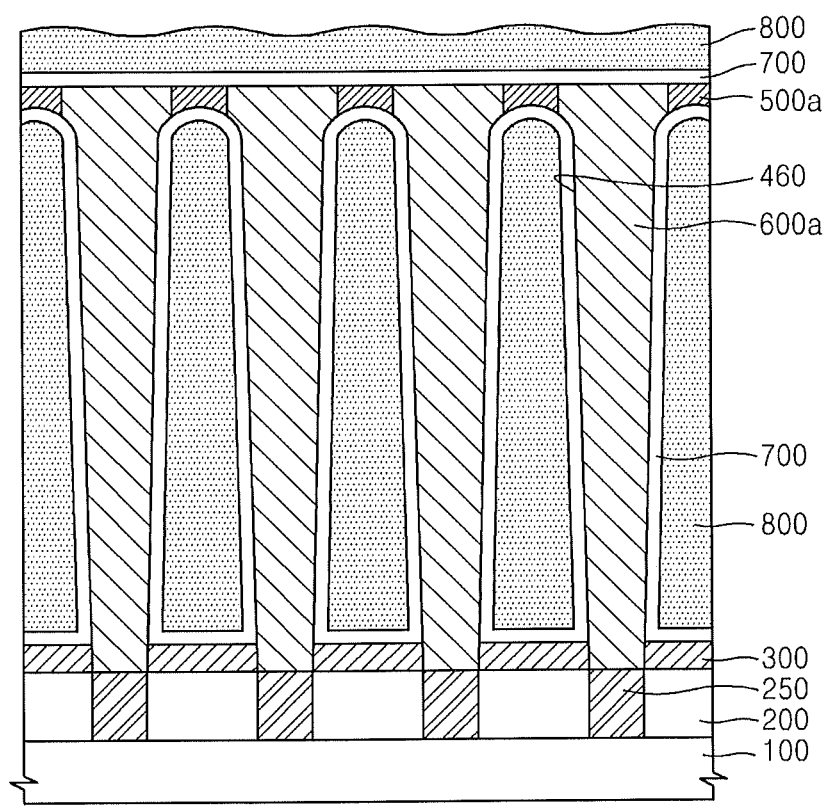
FIG. 8 is a cross-sectional view illustrating operations of forming a top electrode layer according to some embodiments of the inventive concept.

FIG. 8 is a cross-sectional view illustrating operations of forming a top electrode layer 800 according to some embodiments of the inventive concept.

Referring to FIG. 8, a top electrode layer 800 covering the dielectric layer 700 is formed. The top electrode layer 800 may be formed to completely fill the empty space 460. The top electrode layer 800 may be formed of, for example, a metal or a conductive metal nitride layer. The top electrode layer 800 may be formed of at least one conductive material selected from the group consisting of Ti, W, Ta, TiN, NbN, TaN, and/or WN.

Accordingly, a semiconductor device including a plurality of capacitors formed of the plurality of bottom electrodes 600a, the dielectric layer 700 covering a surface of each of the bottom electrodes 600a, and the top electrode layer 800 covering the dielectric layer 700 may be manufactured.

Figure 9:
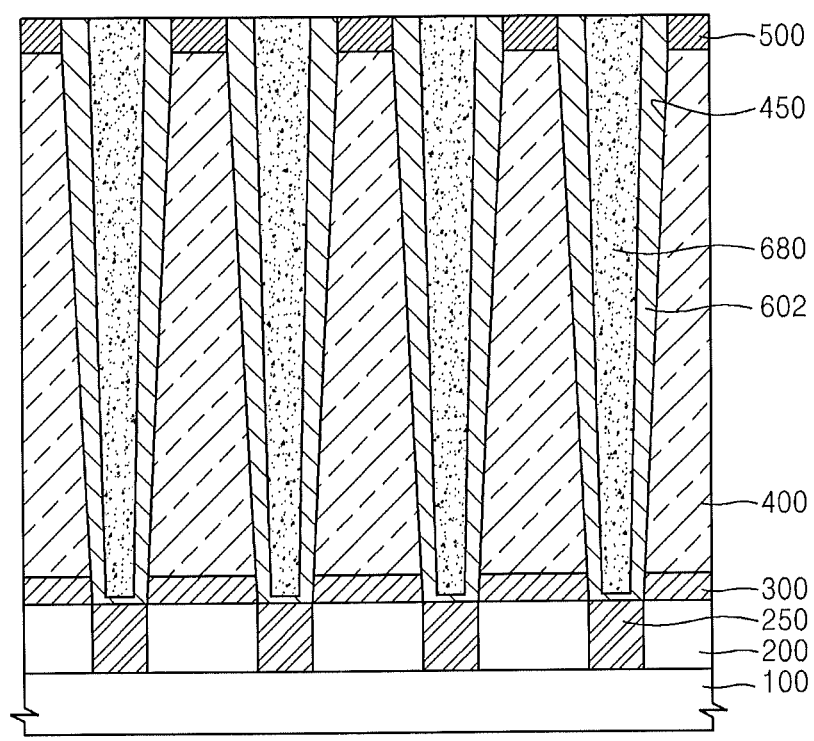
FIGS. 9 and 10 are cross-sectional views illustrating methods of manufacturing a semiconductor device according to some embodiments of the inventive concept.
Figure 10:
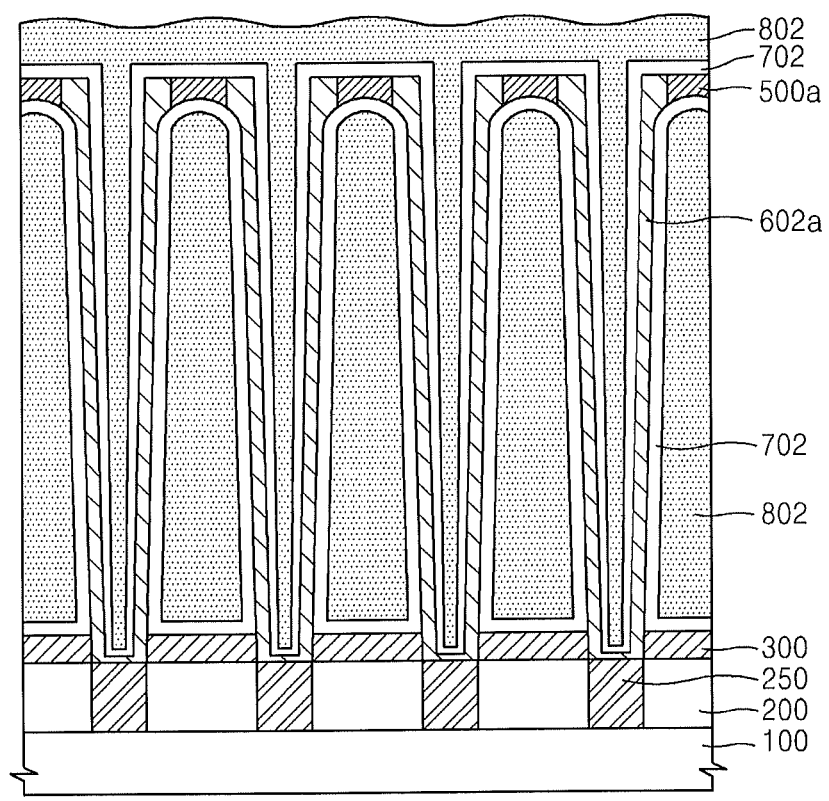

FIGS. 9 and 10 are cross-sectional views illustrating methods of manufacturing a semiconductor device according to some embodiments of the inventive concept.

FIG. 9 is a cross-sectional view illustrating operations of forming a bottom electrode 602 according to some embodiments of the inventive concept. FIG. 9 illustrates an operation after the operation of FIG. 2.

Referring to FIG. 9, a bottom electrode 602 that covers an inner surface of each of the holes 450 is formed on the semiconductor substrate 100. Referring to FIGS. 3 and 9, the bottom electrode 600 of FIG. 3 is formed to fill the holes 450 but the bottom electrode 602 of FIG. 9 is formed to fill the holes 450 not completely but with a relatively thin thickness to cover the inner surface of the holes 450. The bottom electrode 602 may be formed by depositing a conductive material (not shown) on the semiconductor substrate 100 not to completely fill the holes 450, forming a buried layer 680 that fills the holes 450, and then separating the conductive material in each of the holes 450 using a CMP process. The buried layer 680 may be formed of, for example, a material comprising carbon, such as an amorphous carbon layer (ACL).

While the bottom electrode 600 of FIG. 3 has a pillar shape, the bottom electrode 602 of FIG. 9 may have a cylindrical shape.

FIG. 10 is a cross-sectional view illustrating an operation of forming a dielectric layer 702 and a top electrode layer 802 according to another embodiment of the inventive concept.

Referring to FIGS. 9 and 10, after forming the bottom electrode 602, a portion of the bottom electrode 602 is oxidized as illustrated in FIGS. 4 through 7, and the oxidized portion is removed to form a remaining bottom electrode 602a. Here, if only a portion of an external surface of the bottom electrode 602 is to be removed by oxidization, the buried layer 680 is left, and the operations as illustrated in FIGS. 4 through 7 are performed, and if portions of external and internal surfaces of the bottom electrode 602 are both to be removed by oxidizing, the operations as illustrated in FIGS. 4 through 7 are performed after removing the buried layer 680.

FIGS. 11 through 16 are cross-sectional views illustrating a method of manufacturing a semiconductor device according to another embodiment of the inventive concept. Here, description already provided with reference to FIGS. 1 through 10 may be omitted.

Figure 11:
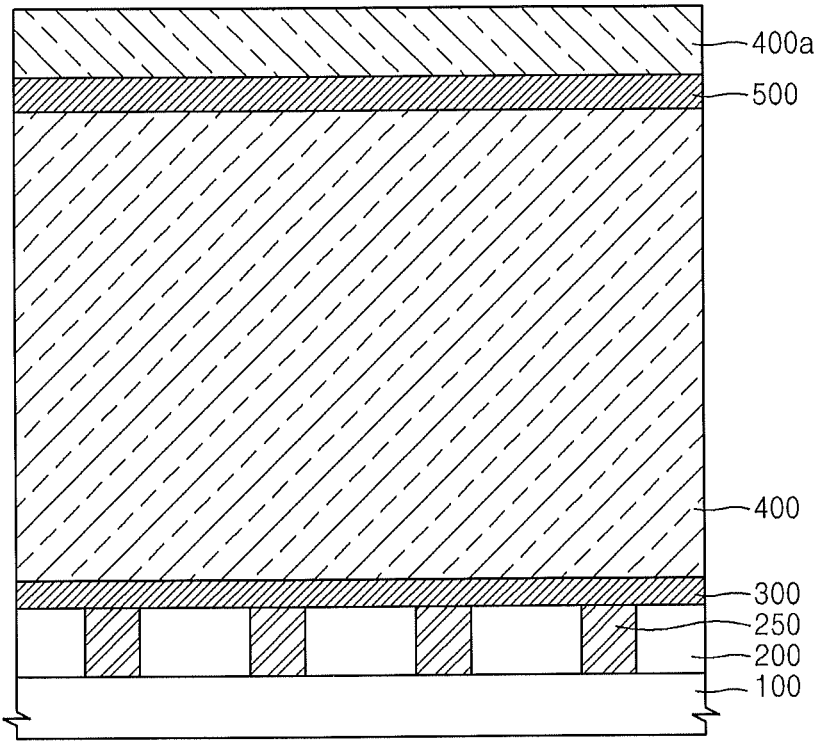
FIGS. 11 through 16 are cross-sectional views illustrating methods of manufacturing a semiconductor device according to some embodiments of the inventive concept.

FIG. 11 is a cross-sectional view illustrating an operation of forming a mold layer 400, a support layer 500, and an auxiliary mold layer 400a according to another embodiment of the inventive concept.

Referring to FIG. 11, after forming the interlayer insulating layer 200 on the semiconductor substrate 100, a contact plug 250 that passes through the interlayer insulating layer 200 is formed. An etch stopper layer 300 covering the interlayer insulating layer 200 and the contact plug 250 may be formed on the semiconductor substrate 100. A mold layer 400 may be formed on the etch stopper layer 300. A support layer 500 may be formed on the mold layer 400. Then, an auxiliary mold layer 400a covering the support layer 500 is formed on the support layer 500.

As illustrated in FIGS. 1 through 10, the mold layer 400 is used as a sacrificial layer to form a bottom electrode having a pillar shape or a cylindrical shape. The auxiliary mold layer 400a may also be used to form a bottom electrode having a pillar shape or a cylindrical shape, and in detail, the auxiliary mold layer 400a is used to form the support layer 500 for supporting the bottom electrode on a portion that is not an uppermost portion of the bottom electrode.

In addition, while a single support layer 500 is formed in FIG. 11, an auxiliary mold layer may be further formed in the same manner so that the support layer may have at least two layers.

Figure 12:
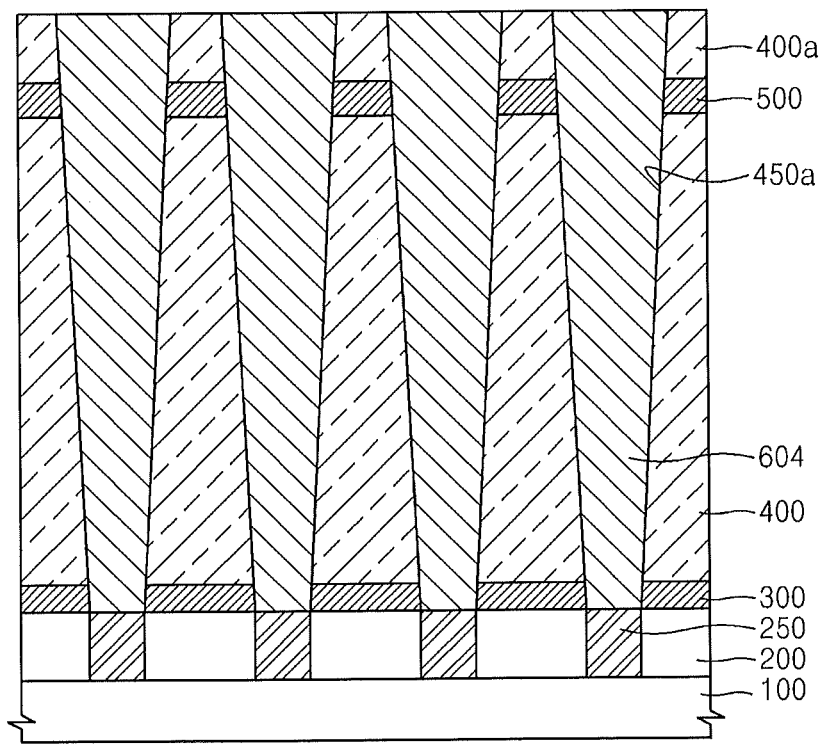

FIG. 12 is a cross-sectional view illustrating an operation of forming a bottom electrode 604 according to another embodiment of the inventive concept.

Referring to FIG. 12, a plurality of holes 450a that pass through the mold layer 400, the support layer 500, and the auxiliary mold layer 400a may be formed, and a plurality of bottom electrodes 604 may be formed in the plurality of holes 450a.

Figure 13:
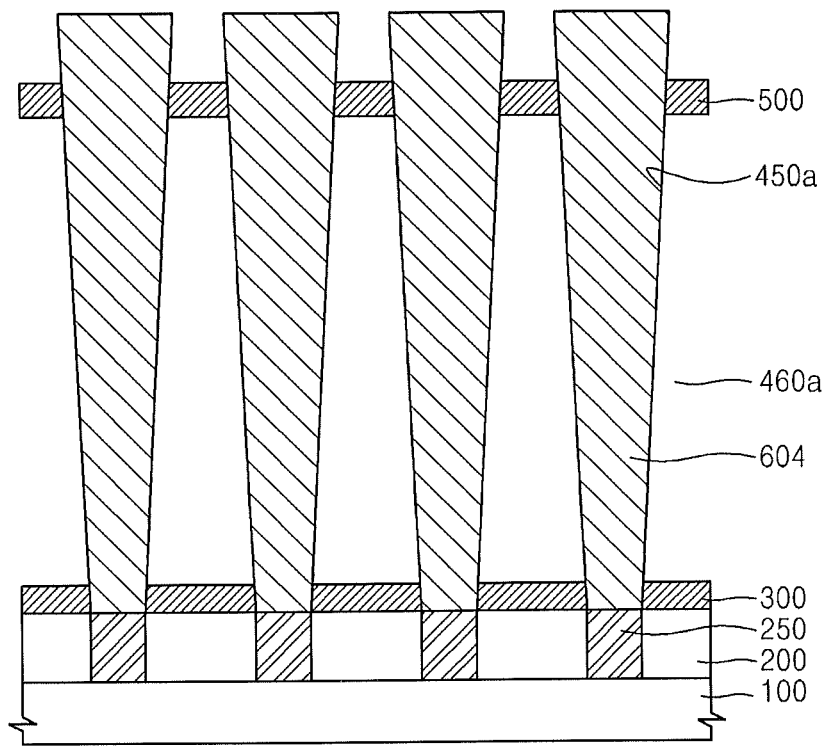

FIG. 13 is a cross-sectional view illustrating an operation of removing the mold layer 400 and the auxiliary mold layer 400a according to another embodiment of the inventive concept.

Referring to FIGS. 12 and 13, the bottom electrode 604 having a pillar shape is formed by removing the mold layer 400 and the auxiliary mold layer 400a. The mold layer 400 and the auxiliary mold layer 400a may be removed using a wet etching operation.

Compared to the bottom electrode 600 of FIG. 3, the bottom electrode 604 of FIG. 12 may protrude over the support layer 500.

In addition, although not shown in FIGS. 12 and 13, a bottom electrode having a cylindrical shape as the bottom electrode 602 of FIG. 9 may also be formed here.

Figure 14:
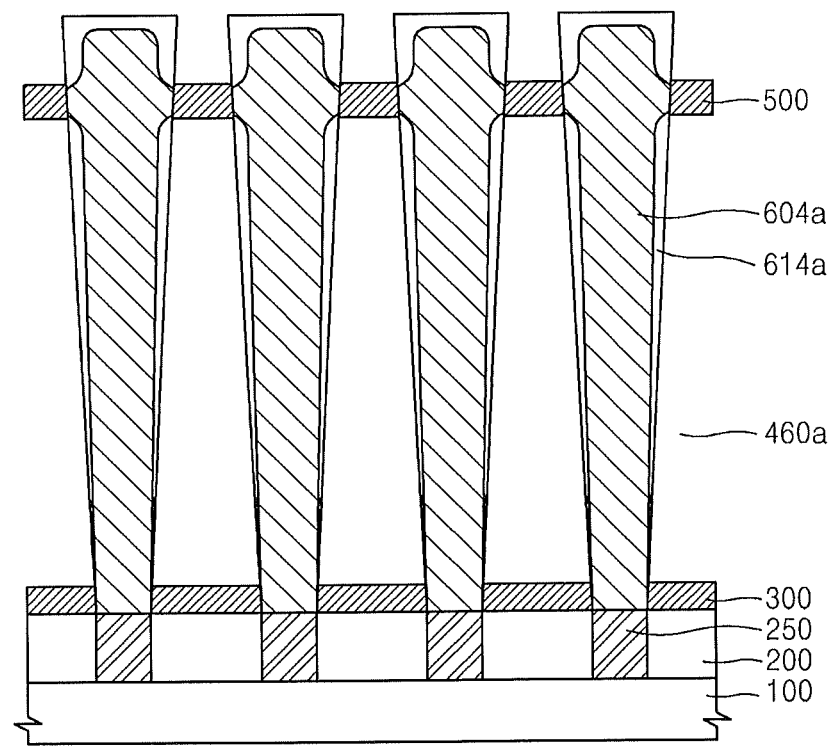

FIG. 14 is a cross-sectional view illustrating an operation of oxidizing a portion of the bottom electrode 604 according to another embodiment of the inventive concept.

Referring to FIGS. 12 through 14, a portion of the bottom electrode 604 is oxidized from each exposed surface of the bottom electrodes 604 that is exposed by removing the mold layer 400 and the auxiliary mold layer 400a, thereby forming an oxidized portion 614a on a remaining bottom electrode 604a.

The oxidized portion 614a may be formed in the atmosphere of $O_2$ plasma, $O_3$ plasma, $O_3$, $O_2$, $H_2O$ (vapor) or in the air atmosphere as illustrated in FIG. 5A or by using the sacrificial oxide layer 650 as illustrated in FIG. 5B.

Figure 15:
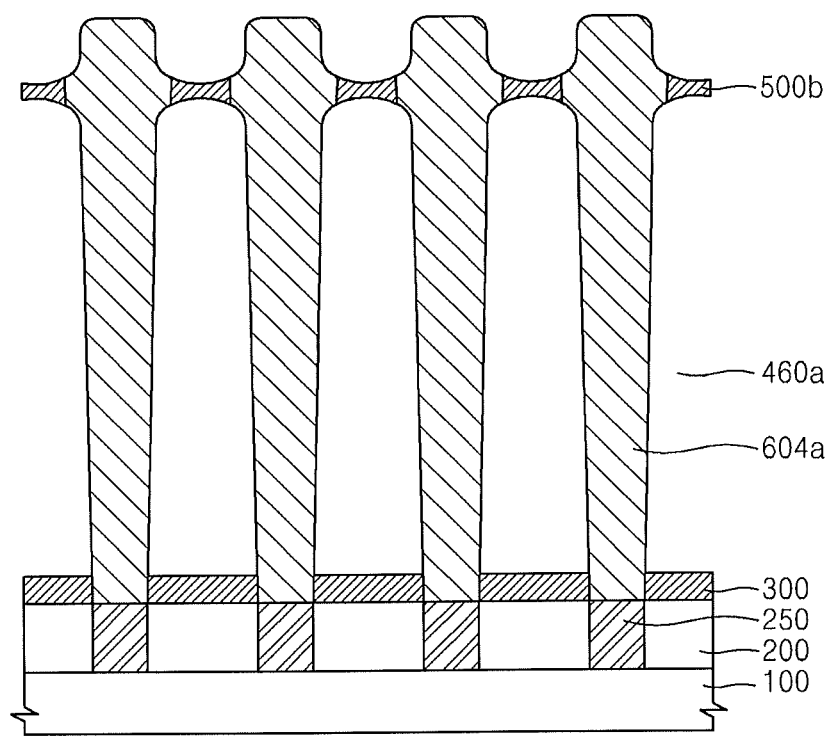

FIG. 15 is a cross-sectional view illustrating an operation of removing the oxidized portion 614a formed on the bottom electrode 604a according to another embodiment of the inventive concept.

Referring to FIGS. 14 and 15, by removing the oxidized portion 614a, the bottom electrode 604a having conductivity is left. Thus, as described above with reference to FIG. 6, in the bottom electrode 604a illustrated in FIG. 15, a ratio of a surface area of a portion of the bottom electrode 604a away from the semiconductor substrate 100 with respect to a surface area of a portion thereof near the semiconductor substrate 100 may be smaller than that in the bottom electrode 604 of FIG. 13.

When removing the oxidized portion 614a, a portion of the support layer 500 is also removed so that a support layer 500b whose exposed surface between adjacent bottom electrodes 604a is concave may be formed.

Figure 16:
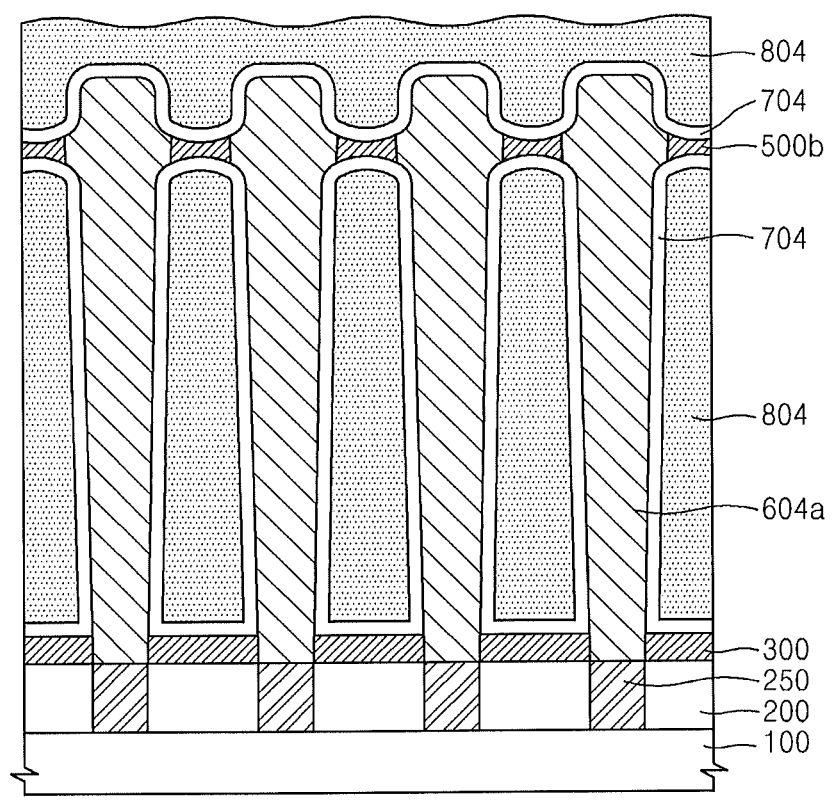

FIG. 16 is a cross-sectional view illustrating an operation of forming a dielectric layer 704 and a top electrode layer 804 according to another embodiment of the inventive concept.

Referring to FIG. 16, a dielectric layer 704 is formed to completely cover the surface of the bottom electrode 604a. Then, a top electrode layer 804 covering the dielectric layer 704 is formed, thereby forming a semiconductor device including a plurality of capacitors formed of the plurality of the bottom electrodes 604a, the dielectric layer 704 covering the surface of the bottom electrodes 604a, and the top electrode layer 804 covering the dielectric layer 704.

FIGS. 17 through 22 are cross-sectional views illustrating a method of manufacturing a semiconductor device according to another embodiment of the inventive concept. Here, description already provided with reference to FIGS. 1 through 16 may be omitted.

Figure 17:
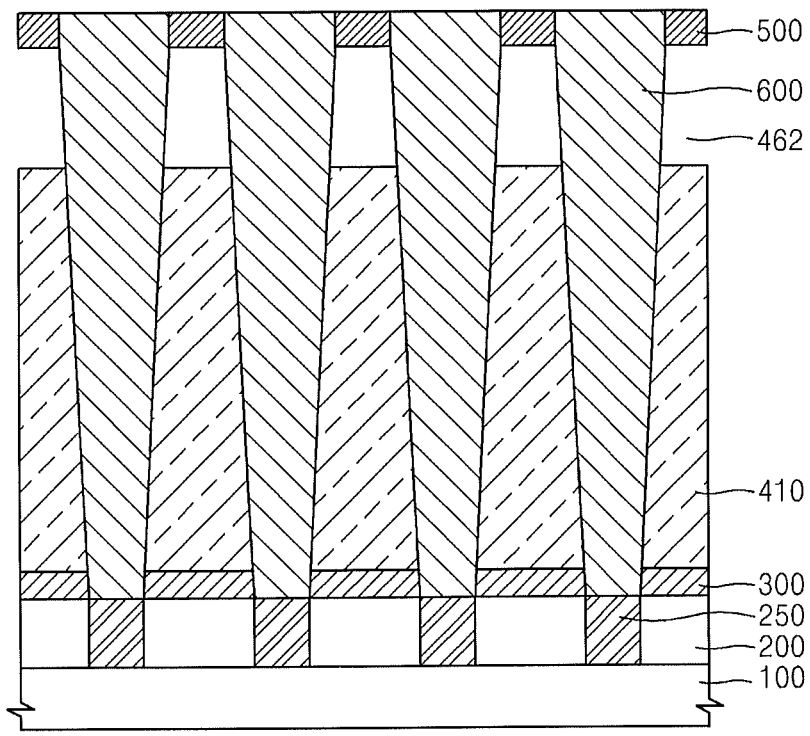
FIGS. 17 through 22 are cross-sectional views illustrating methods of manufacturing a semiconductor device according to some embodiments of the inventive concept.

FIG. 17 is a cross-sectional view illustrating an operation of removing only an upper portion of the mold layer 400 of FIG. 3, according to another embodiment of the inventive concept. In detail, FIG. 17 illustrates an operation after the operation of FIG. 3.

Referring to FIGS. 3 and 17, only an upper portion of the mold layer 400 is removed to form a first remaining mold layer 410, which is a portion of the mold layer 400. A first empty space 462 is formed where the portion of the mold layer 400 is removed. A portion of the bottom electrode 600 may be exposed by the first remaining mold layer 410. The portion of the mold layer 400 may be removed using a wet etching operation. The mold layer 400 may be removed using, for example, a LAL lift-off operation.

Figure 18:
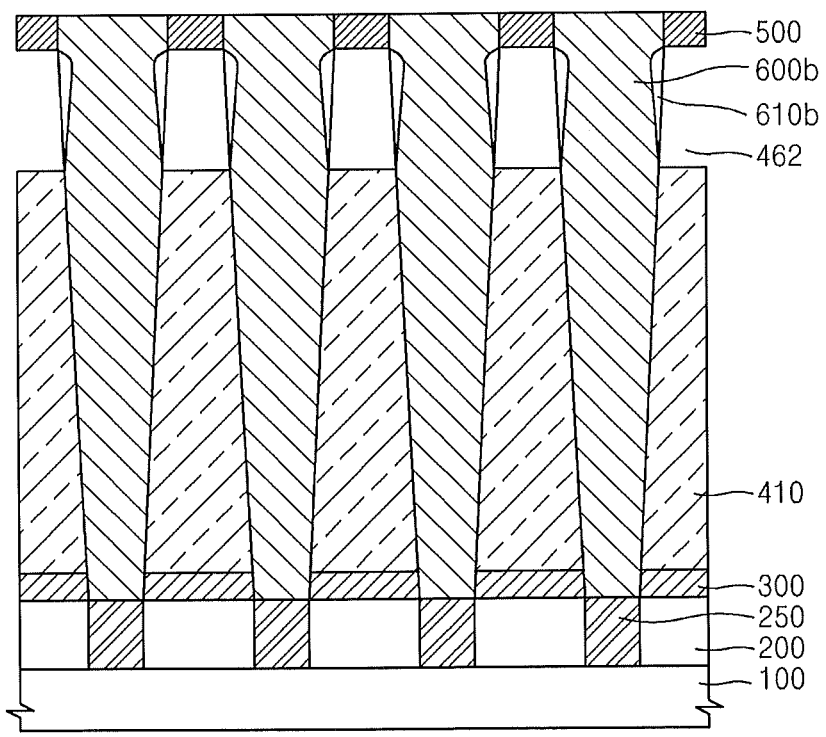

FIG. 18 is a cross-sectional view illustrating an operation of oxidizing a portion of the bottom electrode 600 according to another embodiment of the inventive concept.

Referring to FIGS. 3, 17, and 18, a portion of the bottom electrodes 600 is oxidized from each exposed surface of the bottom electrodes 600 that is exposed by the first remaining mold layer 410, thereby forming a first oxidized portion 610b on a remaining bottom electrode 600b. The first oxidized portion 610b may be formed in the atmosphere of $O_2$ plasma, $O_3$ plasma, $O_3$, $O_2$, $H_2O$ (vapor) or in the air atmosphere.

Figure 19:
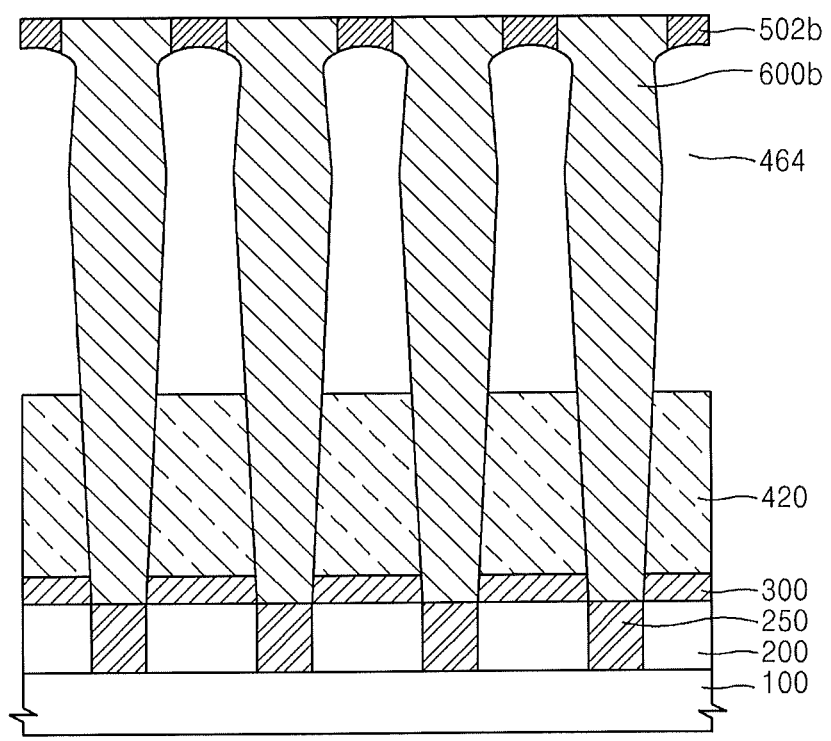

FIG. 19 is a cross-sectional view illustrating an operation of removing an upper portion of the first remaining mold layer 410 according to another embodiment of the inventive concept.

Referring to FIGS. 18 and 19, only an upper portion of the first remaining mold layer 410 is removed to form a second remaining mold layer 420 which is a portion of the first remaining mold layer 410. As a portion from which the portion of the first remaining mold layer 410 is removed is added to the first empty space 462, the first empty space 462 is extended to second empty space 464. A portion of the remaining bottom electrode 600b may be exposed by the second remaining mold layer 420. The portion of the first remaining mold layer 410 may be removed using a wet etching operation. The portion of the first remaining mold layer 410 may be removed using, for example, a LAL lift-off operation.

When removing the first remaining mold layer 410, the first oxidized portion 610b may also be removed at the same time. In addition, by removing the portion of the first remaining mold layer 410, a portion of the support layer 500 may also be removed, thereby forming a support layer 502b whose exposed surface between adjacent bottom electrodes 600b is concave.

Figure 20:
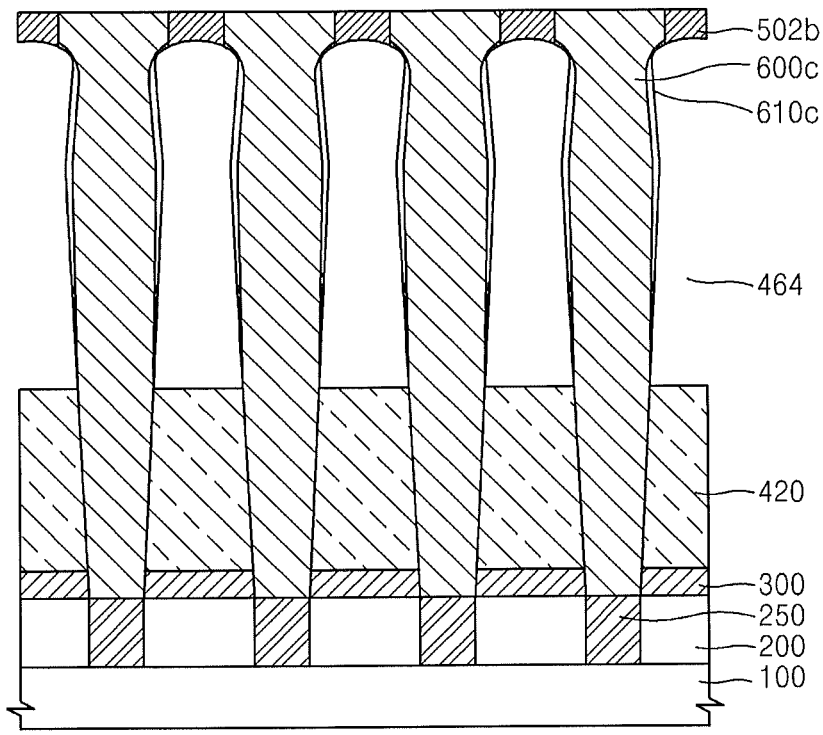

FIG. 20 is a cross-sectional view illustrating an operation of further oxidizing a portion of the bottom electrode 600b according to another embodiment of the inventive concept.

Referring to FIGS. 19 and 20, a portion of the bottom electrodes 600b is oxidized from each exposed surface of the remaining bottom electrodes 600b that is exposed by the second remaining mold layer 420, thereby forming a second oxidized portion 610c on the remaining bottom electrode 600b. The second oxidized portion 610c may be formed in the atmosphere of $O_2$ plasma, $O_3$ plasma, $O_3$, $O_2$, $H_2O$ (vapor) or in the air atmosphere.

Figure 21:
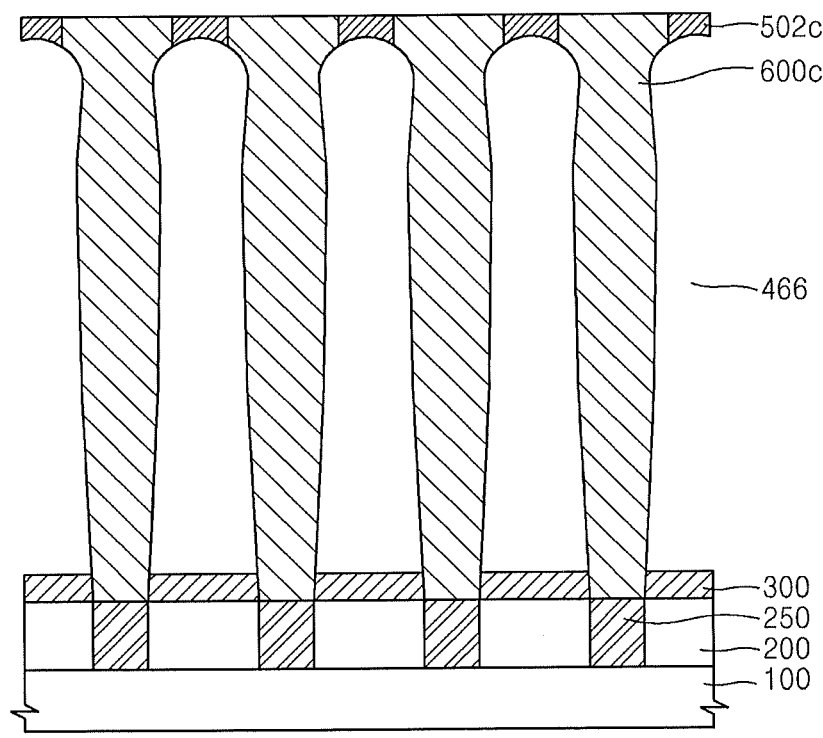

FIG. 21 is a cross-sectional view illustrating an operation of removing the second remaining mold layer 420 according to another embodiment of the inventive concept.

Referring to FIGS. 20 and 21, the second remaining mold layer 420 is completely removed. As a portion from which the portion of the second remaining mold layer 420 is removed is added to the second empty space 464, the second empty space 464 is extended to third empty space 466. The second remaining mold layer 420 may be removed using a wet etching operation. The second remaining mold layer 420 may be removed using, for example, a LAL lift-off operation.

When removing the second remaining mold layer 420, the second oxidized portion 610c may also be removed at the same time. In addition, when removing a portion of the second remaining mold layer 420, a portion of the support layer 502b may also be removed, thereby forming a support layer 502c whose exposed surface between adjacent bottom electrodes 600c is more concave.

Referring to FIGS. 17 through 21, the bottom electrode 600c may be formed by removing the first oxidized portion 610b and the second oxidized portion 610c. That is, with respect to the bottom electrode 600 illustrated in FIG. 17, the first oxidized portion 610b and the second oxidized portion 610c are both removed from an upper portion of the bottom electrode 600, and from a middle portion of the bottom electrode 600, the second oxidized portion 610c is removed, and a lower portion of the bottom electrode 600 is left unchanged. Accordingly, if a diameter of the upper portion of the bottom electrode 600 has a relatively large diameter compared to the lower portion of the bottom electrode 600, more of the bottom electrode 600 may be removed from the lower portion toward the upper portion so as to form the bottom electrode 600c in which a ratio between surfaces areas of the lower portion and the upper portion of the bottom electrode 600 is reduced.

In other words, the mold layer 400 of FIG. 3 may be removed from the upper portion thereof by sequentially performing partial removing operations of three times, and portions of the bottom electrodes 600 or 600b may be removed from each exposed surface thereof between ones of the partial removing operations of three times to thereby form the bottom electrodes 600c. In addition, while three times of removing operations of the mold layer 400 are illustrated, the embodiments of the inventive concept are not limited thereto, and the mold layer 400 may be removed several times, and portions of the bottom electrodes 600 or 600b may also be removed between one of the partial removing operations.

Figure 22:
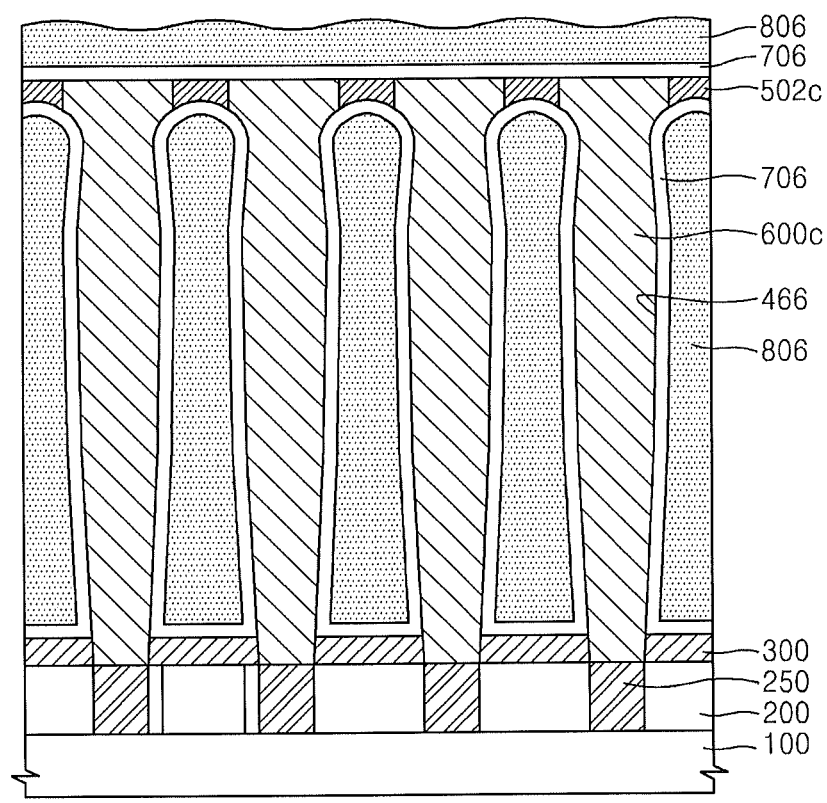

FIG. 22 is a cross-sectional view illustrating an operation of forming a dielectric layer 706 and a top electrode layer 806 according to another embodiment of the inventive concept.

Referring to FIG. 22, a dielectric layer 706 is formed to completely cover the surface of the bottom electrode 600c. Then, a top electrode layer 806 covering the dielectric layer 706 is formed, thereby forming a semiconductor device including a plurality of capacitors formed of the plurality of the bottom electrodes 600c, the dielectric layer 706 covering the surface of each of the bottom electrodes 600c, and the top electrode layer 806 covering the dielectric layer 706.

Figure 23:
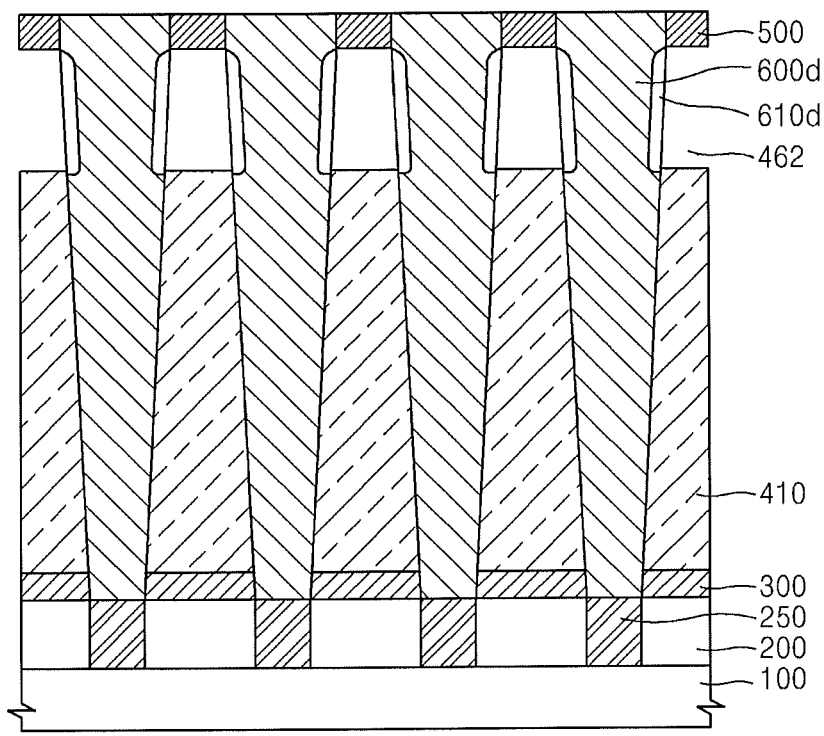
FIGS. 23 through 27 are cross-sectional views illustrating methods of manufacturing a semiconductor device according to some embodiments of the inventive concept.
Figure 24:
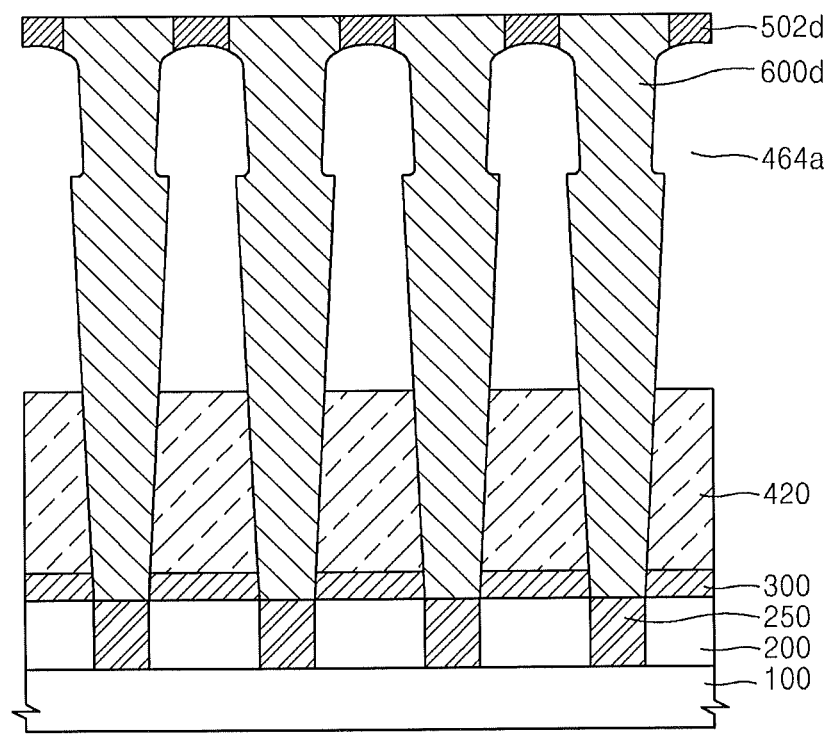
Figure 25:
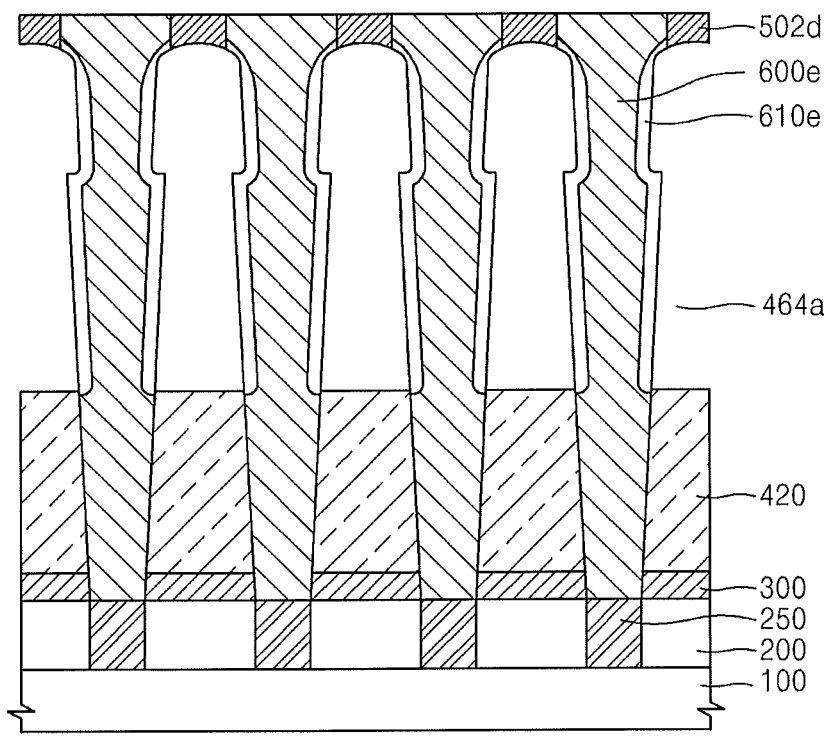
Figure 26:
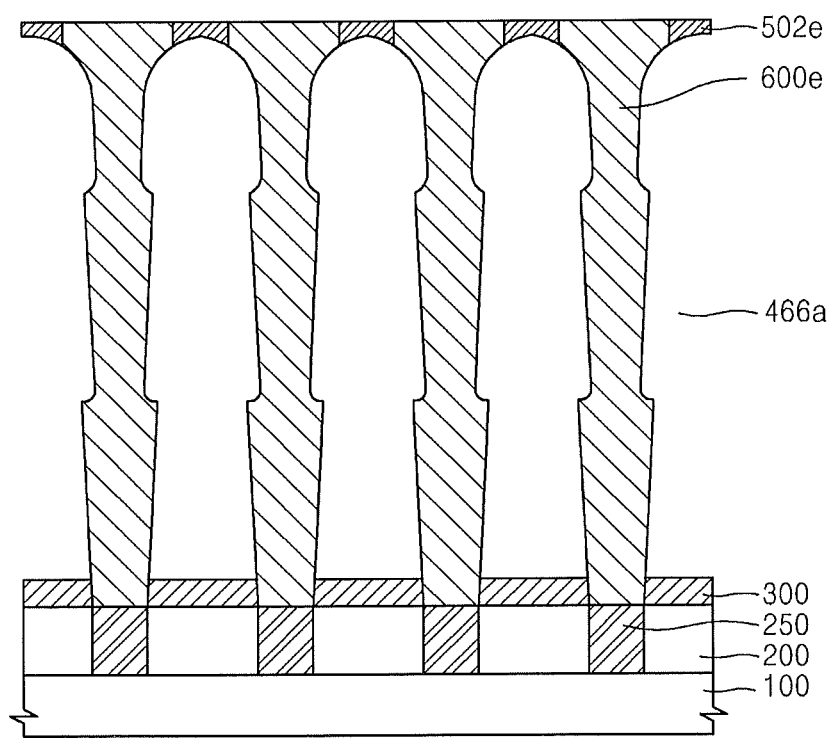

FIGS. 23 through 27 are cross-sectional views illustrating a method of manufacturing a semiconductor device according to another embodiment of the inventive concept. In detail, FIG. 23 illustrates an operation after the operation of FIG. 17. In addition, FIGS. 23 through 27 are cross-sectional views illustrating operations respectively corresponding to the operations illustrated in FIGS. 18 through 22.

Referring to FIGS. 23 through 27, a first oxidized portion 610d and a second oxidized portion 610e may have almost equivalent thicknesses regardless of how far they are each spaced apart from the semiconductor substrate 100. Accordingly, bottom electrodes 600d and 600e may have step portions corresponding to the number of times the first oxidized portion 610d and the second oxidized portion 610e are removed.

Figure 27:
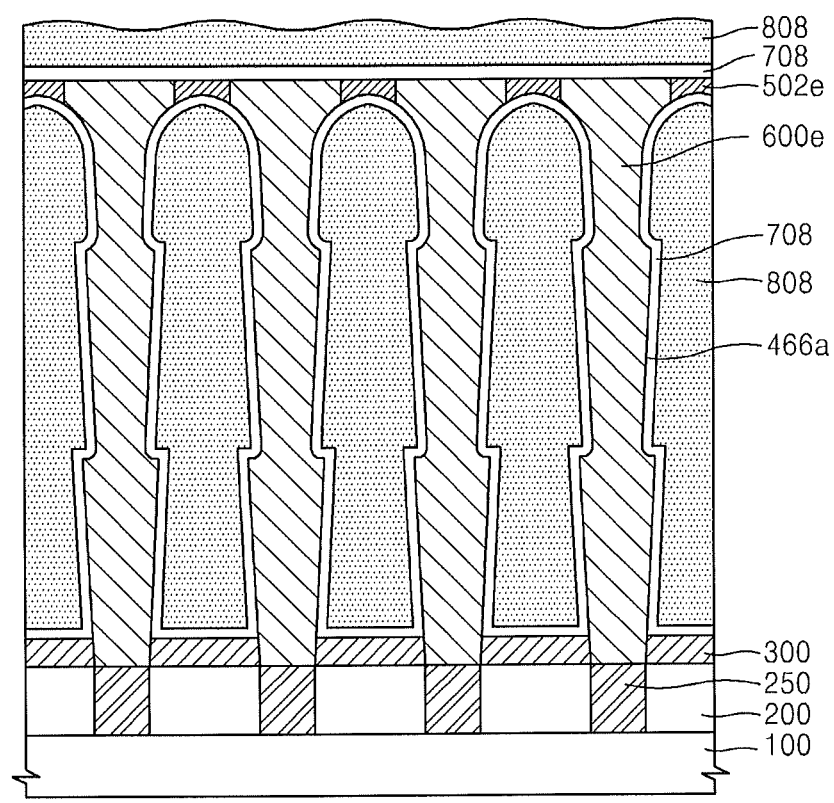

In other words, referring to FIG. 27, the bottom electrode 600e has a three-step shape including two stepped portions, and this shape indicates that the mold layer 400 of FIG. 3 is partially removed three times and oxidized twice, and oxidized portions thereof are removed.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
    forming a plurality of bottom electrodes in a plurality of holes that pass through a mold layer and a support layer;
    exposing a surface of the plurality of bottom electrodes by removing a portion of the mold layer;
    removing a portion of ones of the plurality of bottom electrodes from the exposed surface of respective ones of the plurality of bottom electrodes; and
    sequentially forming a dielectric layer and a top electrode layer on the plurality of bottom electrodes,
    wherein removing the portion of ones of the plurality of bottom electrodes comprises removing a portion of an exposed portion of the support layer such that a surface of the support layer exposed between adjacent bottom electrodes among the plurality of bottom electrodes is concavely formed.

2. The method according to claim 1, wherein exposing the portion of the plurality of bottom electrodes by removing the portion of the mold layer comprises performing partial removing operations a plurality of times.

3. The method according to claim 1, wherein removing the portion of the ones of the plurality of bottom electrodes comprises:
   oxidizing a portion of ones of the plurality of bottom electrodes from each exposed surface of the ones of the plurality of bottom electrodes; and
   removing the oxidized portion of the ones of the plurality of bottom electrodes.

4. The method according to claim 3, wherein oxidizing the portion of the ones of the plurality of bottom electrodes is performed in an atmosphere of $O_2$ plasma, $O_3$ plasma, $O_3$, $O_2$, or $H_2O$ (vapor) and/or in the air atmosphere.

5. The method according to claim 3, wherein oxidizing the portion of ones of the plurality of bottom electrodes comprises forming a sacrificial oxide layer on each exposed surface of the ones of the plurality of bottom electrodes.

6. The method according to claim 1, wherein exposing the surface of the plurality of bottom electrodes comprises removing only an upper portion of the mold layer.

7. The method according to claim 6, wherein removing the portion of ones of the plurality of bottom electrodes comprises removing a portion of a remaining portion of the mold layer.

8. The method according to claim 1, wherein exposing the surface of the plurality of bottom electrodes comprises completely removing the mold layer.

9. The method according to claim 1, wherein removing the portion of ones of the plurality of bottom electrodes comprises removing a portion of an exposed portion of the support layer.

10. The method according to claim 9, wherein removing the portion of ones of the plurality of bottom electrodes comprises removing a portion of an exposed portion of the support layer, wherein the support layer has a thinner thickness away from each of the plurality of the bottom electrodes.

11. The method according to claim 1, wherein removing the portion of ones of the plurality of bottom electrodes comprises removing a portion of the bottom electrodes that is distal relative to the semiconductor substrate from an exposed surface of the bottom electrodes more than a portion of the bottom electrodes that is proximal to the semiconductor substrate.

12. The method according to claim 1, further comprising preparing the semiconductor substrate including the mold layer and the support layer that is disposed on the mold layer,
wherein removing the portion of ones of the plurality of bottom electrodes comprises increasing a distance between adjacent bottom electrodes from among the plurality of bottom electrodes more in a portion that is distal relative to the semiconductor substrate than in a portion that is proximal to the semiconductor substrate.

13. The method according to claim 1, wherein the plurality of bottom electrodes are formed of a metal and/or a conductive metal nitride.

14. A method of manufacturing a semiconductor device, the method comprising:
   forming a plurality of holes that pass through a mold layer and a support layer on a semiconductor substrate;
   forming a plurality of bottom electrodes in the plurality of holes;
   removing the mold layer to expose the plurality of bottom electrodes by removing a plurality of portions of the mold layer using a corresponding plurality of partial removing operations; and
   sequentially forming a dielectric layer and a top electrode layer on the plurality of bottom electrodes,
wherein removing the portion of the plurality of bottom electrodes comprises removing a portion of an exposed portion of the support layer such that a surface of the support layer exposed between adjacent bottom electrodes among the plurality of bottom electrodes is concavely formed.

15. The method according to claim 14, further comprising, between ones of the partial removing operations:
   oxidizing a portion of the plurality of bottom electrodes from each exposed surface of the plurality of bottom electrodes; and
   removing a portion of the plurality of oxidized bottom electrodes.

16. The method according to claim 15,
   wherein removing the portion of the plurality of bottom electrodes comprises removing a portion of the plurality of bottom electrodes to expose portions of the plurality of the bottom electrodes, and
   wherein a ratio of a surface area of a portion of the bottom electrodes that is distal the semiconductor substrate with respect to a surface area of a portion of the bottom electrodes that is proximal the semiconductor substrate is reduced.

* * * * *